United States Patent
Shtargot et al.

(10) Patent No.: US 7,108,559 B2
(45) Date of Patent: Sep. 19, 2006

(54) ROUTER WITH FIELD REPLACEABLE MOTHERBOARD

(75) Inventors: Helen Shtargot, Foster City, CA (US); Dattatri Mattur, Sunnyvale, CA (US); Shawn Bender, Campbell, CA (US); William J. Lewis, Mountain View, CA (US); Lwin Tint, Newark, CA (US); David Tarkington, Sunnyvale, CA (US); Ming Chi Chen, Union City, CA (US); Rene Duzac, San Jose, CA (US); James Everett Grishaw, Santa Clara, CA (US); Torence Lu, Fremont, CA (US); Kimberly Rae Turner, Apex, NC (US); Phong Hoang Ho, Cary, NC (US); Robert A. Loose, Cary, NC (US); Stephen Scearce, Apex, NC (US)

(73) Assignee: Cisco Technology, INc., San Jose, CA (US)

( * ) Notice: Subject to any disclaimer, the term of this patent is extended or adjusted under 35 U.S.C. 154(b) by 0 days.

(21) Appl. No.: 11/020,733

(22) Filed: Dec. 21, 2004

(65) Prior Publication Data

US 2005/0117282 A1   Jun. 2, 2005

Related U.S. Application Data

(63) Continuation-in-part of application No. 10/934,788, filed on Sep. 3, 2004, now abandoned, which is a continuation of application No. 10/227,472, filed on Aug. 23, 2002, now Pat. No. 6,796,843.

(60) Provisional application No. 60/615,911, filed on Oct. 4, 2004.

(51) Int. Cl.
H01R 25/00 (2006.01)
H01R 12/00 (2006.01)
H01R 27/02 (2006.01)
H01R 31/00 (2006.01)
H05K 1/00 (2006.01)

(52) U.S. Cl. .................................. 439/638; 439/69

(58) Field of Classification Search ............... 439/638, 439/61, 607, 79, 80; 361/724
See application file for complete search history.

(56) References Cited

U.S. PATENT DOCUMENTS

| | | | | |
|---|---|---|---|---|
| 4,677,527 A | * | 6/1987 | Pasterchick et al. | ......... 361/737 |
| 5,184,961 A | * | 2/1993 | Ramirez et al. | ............... 439/59 |
| 5,492,481 A | * | 2/1996 | Lewis | ......................... 439/159 |
| 5,509,826 A | * | 4/1996 | White | ......................... 439/637 |
| 5,549,480 A | * | 8/1996 | Cheng | ........................... 439/79 |
| 5,816,827 A | * | 10/1998 | Nelson et al. | ................. 439/64 |
| 6,000,953 A | * | 12/1999 | Quillet et al. | .................. 439/79 |
| 6,058,025 A | * | 5/2000 | Ecker et al. | ................. 361/816 |
| 6,068,500 A | * | 5/2000 | Kantner | ...................... 439/218 |
| 6,483,709 B1 | * | 11/2002 | Layton | ........................ 361/724 |
| 6,590,153 B1 | * | 7/2003 | Kohan | ....................... 174/35 C |

* cited by examiner

*Primary Examiner*—Chandrika Prasad
(74) *Attorney, Agent, or Firm*—Charles E. Krueger

(57) ABSTRACT

A router includes WIC and Network Module slots that be reconfigured to hold cards and network modules having different form factors. A motherboard/midplane arrangement provides for a field replaceable motherboard that can be replaced without removing the router from the rack.

2 Claims, 15 Drawing Sheets

ROUTER WITH FIELD REPLACEABLE MOTHERBOARD

RELATED APPLICATIONS

This application claims priority from the provisional application entitled ROUTER WITH RECONFIGURABLE SLOTS AND FIELD REPLACEABLE MOTHERBOARD, filed Oct. 4, 2004, A/N 60/615,911 and is a continuation-in-part of the patent application entitled CONNECTOR ASSEMBLY THAT MAINTAINS BACKWARD COMPATIBILITY, filed Sep. 3, 2004, application Ser. No. 10/934,788, now abandoned which is a continuation of application Ser. No. 10/227,472 filed Aug. 23, 2002 now U.S. Pat. No. 6,796,843, where all applications are hereby incorporated by reference for all purposes.

BACKGROUND OF THE INVENTION

A typical router or switch configuration includes a chassis which contains basic components such as power supply, fans, and slots where interface cards and network modules that are inserted into the slots. The line cards which are inserted into card slots and modules which are inserted into module slots handle packet ingress and egress and other networking functions. Line cards provide one or more interfaces over which traffic flows. Thus, depending on the number of slots and interfaces, a switch or a router can be configured to work with a variety of networking protocols. Some switches are fixed configuration switches that do not use line cards to implement interfaces.

Network module and interface card developers are constantly developing new configurations having different dimensions, connector configurations, and electrical requirements. Customers for routers and switches are concerned that their investment will be made obsolete when new, higher performance modules or interfaces are introduced that are not compatible with a purchased router or switch. Additionally, customers may initially purchase devices configured to accept modules of one configuration set and then decide that the use of another configuration would be beneficial.

The challenges in the field of communications continue to increase with demands for more and better techniques having greater flexibility and adaptability. Therefore, a need has arisen for a new system and method for providing reconfigurable slots in a router chassis.

Accordingly, improvements are required to protect customer investments and provide compatibility with new products. One example of an approach to provide a new interface with backward compatibility is disclosed in a co-pending, commonly assigned patent application entitled Improved Connector Assembly Including Legacy and Extension Parts That Maintains Backward Compatibility (amended), application Ser. No. 10/227,472, filed Aug. 23, 2002, which is hereby incorporated by reference for all purposes.

That application discloses an HWIC (High Speed WAN Interface Card) connector having a legacy part compatible with switches configured to utilize legacy WIC cards and an extension part utilized by HWIC cards.

Accordingly, new solutions to provide compatibility with legacy products and enable reconfiguration important to the industry.

BRIEF SUMMARY OF THE INVENTION

In a first embodiment of the invention, a field replaceable motherboard has a narrow insertion section that is positioned in a cutaway section of a midplane. Connectors on a wide external section of the motherboard and on midplane tabs bounding the cutaway section mate when the motherboard is inserted into the router.

In another embodiment of the invention, a card slot is configurable to hold either two single-wide cards or one double-wide card. A card slot divider is inserted into or removed from the card slot to reconfigure the card slot.

In another embodiment of the invention, a Network Module slot can be divided into various configurations to hold Network Module having different form factors.

Other features and advantages of the invention will now be apparent in view of the following detailed description and appended drawings.

DETAILED DESCRIPTION OF THE INVENTION

Reference will now be made in detail to various embodiments of the invention. Examples of these embodiments are illustrated in the accompanying drawings. While the invention will be described in conjunction with these embodiments, it will be understood that it is not intended to limit the invention to any embodiment. On the contrary, it is intended to cover alternatives, modifications, and equivalents as may be included within the spirit and scope of the invention as defined by the appended claims. In the following description, numerous specific details are set forth in order to provide a thorough understanding of the various embodiments. However, the present invention may be practiced without some or all of these specific details. In other instances, well known process operations have not been described in detail in order not to unnecessarily obscure the present invention.

The invention will now be described with reference to various embodiments implemented in a router. In the following, the term router is utilized broadly to include any component such as a router, bridge, switch, layer 2 or layer 3 switch, gateway, etc., that is utilized to implement connectivity within a network or between networks. In the following, embodiments will be described, by way of example, not limitation, that operate on routers designed and manufactured by the assignee of the present patent application. However, it is understood by persons of skill in the art that the invention has broad utility in any router.

Figure 1A:
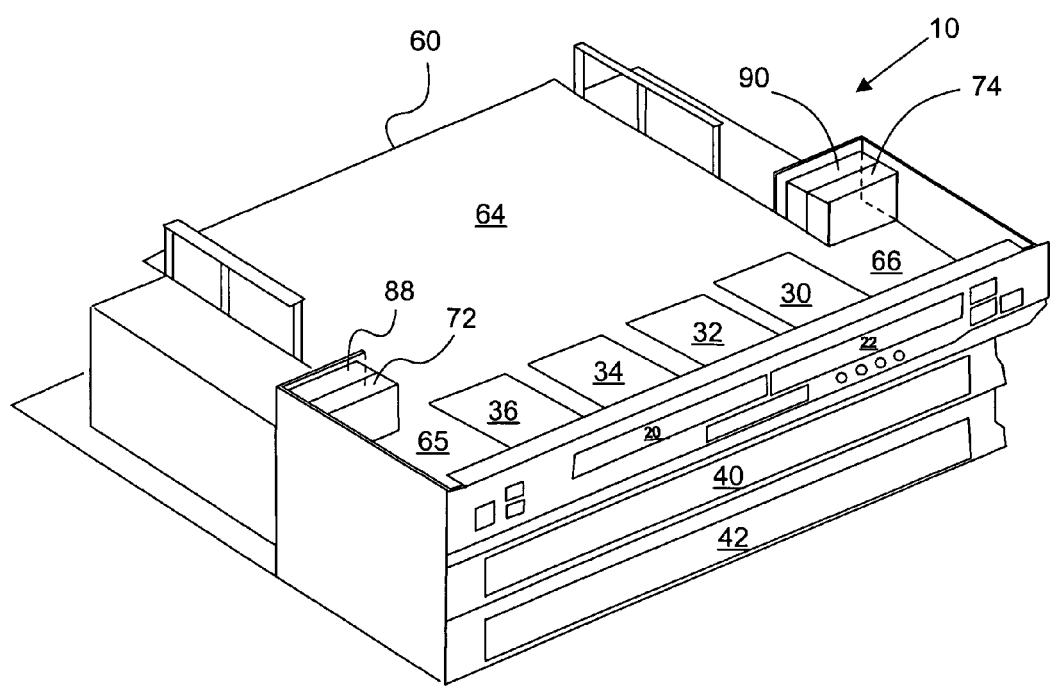
FIGS. 1A and B are perspective view of the interior of a router chassis depicting an embodiment of the invention.
Figure 1B:
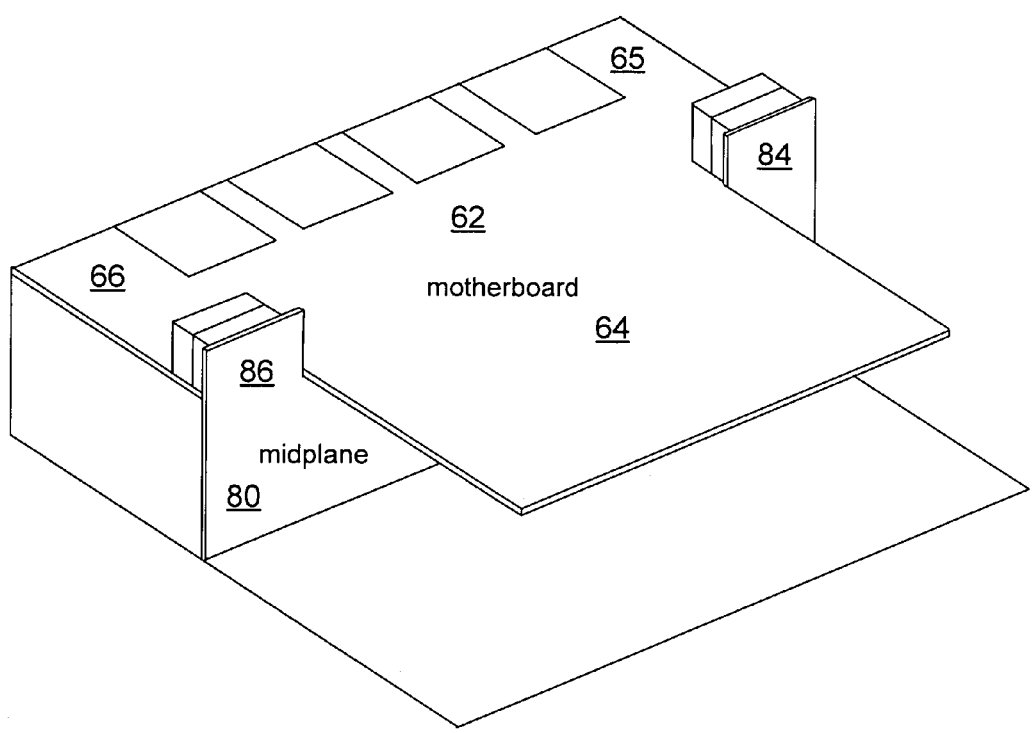
Figure 2:
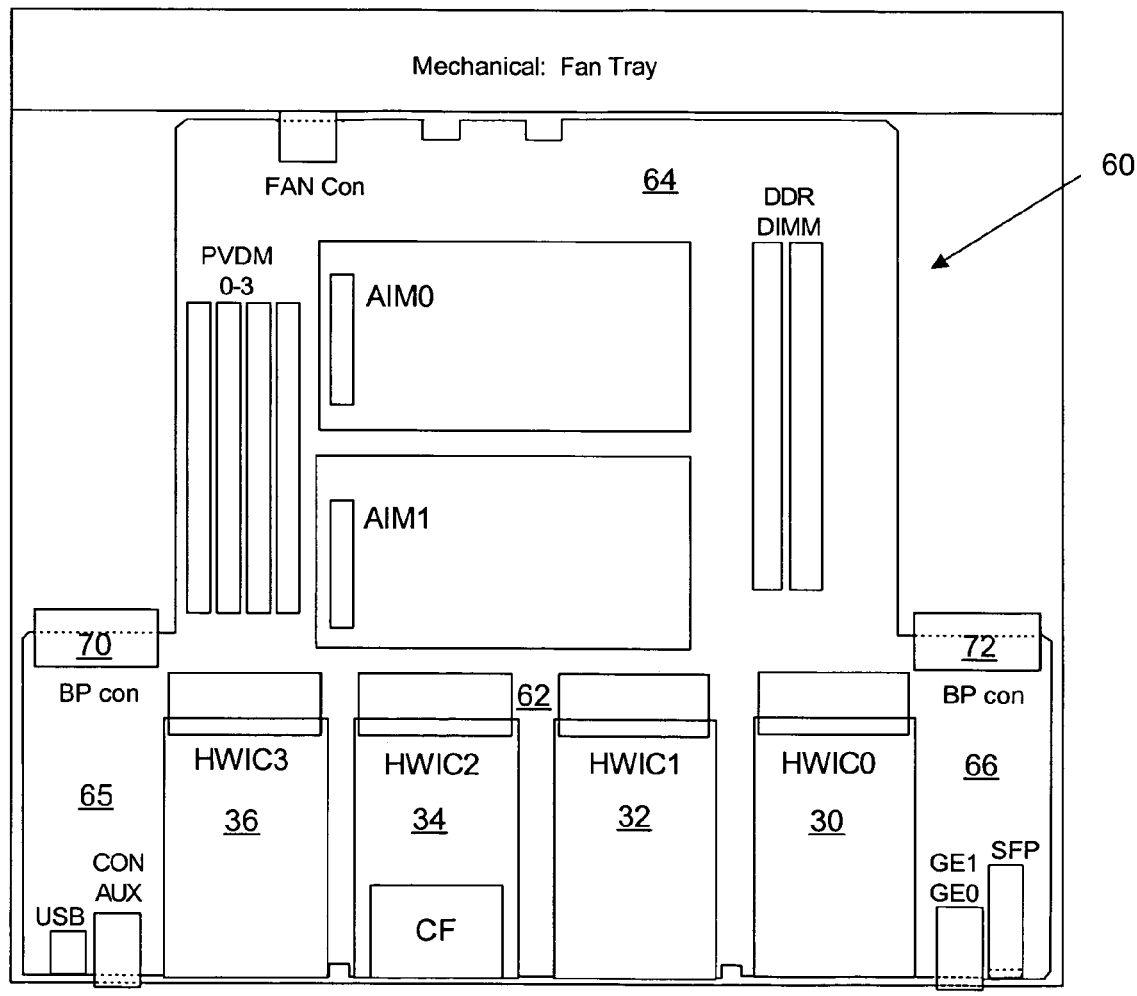
FIG. 2 is a schematic top view of a motherboard.
Figure 3:
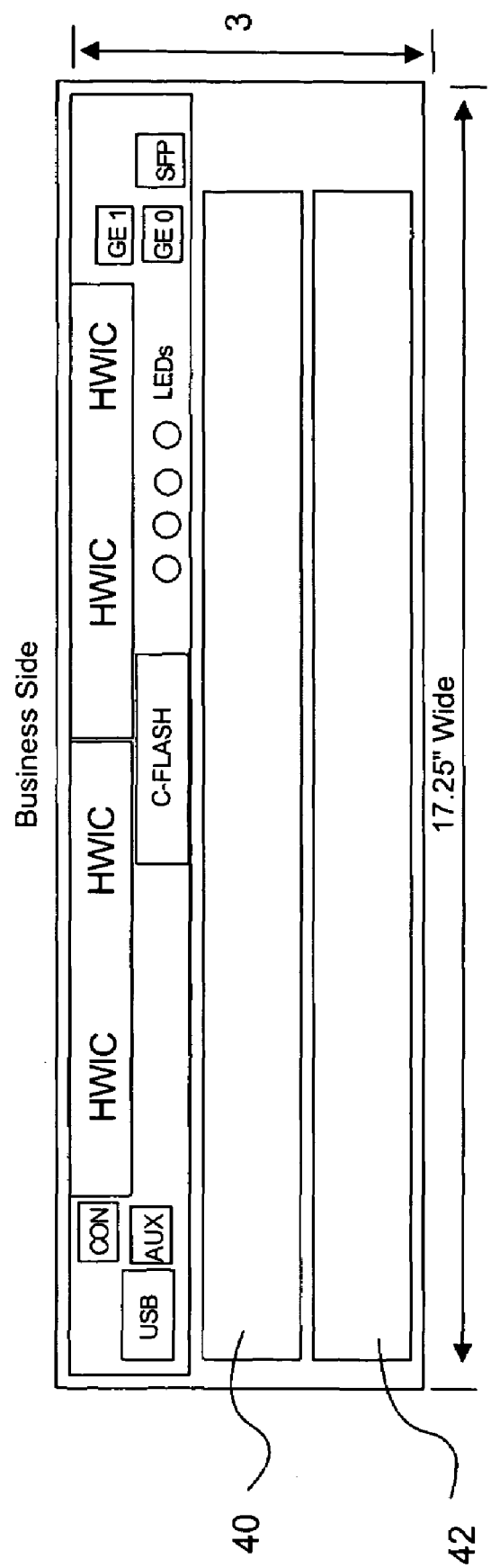
FIG. 3 is a block diagram of the business end of a router.

FIGS. 1A and B are perspective views, from two different viewpoints, of the interior of a router chassis showing parts of an embodiment of the invention and FIG. 2 is a schematic top view of the motherboard. The chassis includes a business side having slots for holding various modules. A schematic view of the business side of the chassis depicted in FIGS. 1A and B and FIG. 2 is depicted in FIG. 3.

Turning first to FIG. 1A, the "business side" of the router 10 (depicted schematically in FIG. 3) includes two card slots 20–22 partitioned (as described in detail below) to hold four cards 30–36 that may be Wide Area Network Interface Cards (WICs), Voice Interface Cards (VICs), Voice/Data Interface Cards (VWICs), High Speed Network Interface Cards (HWICs), or other types of interface cards.

The figure also depicts two Network Module (NM) slots 40 and 42 each configurable (as described below) to hold various combinations of Extended Double Wide Network Modules (XDWNMs), Double Wide Network Modules (DWNMs), Extended Single Wide Network Modules (XSWNMs) and/or Single Wide Network Modules (SWNMs).

As depicted in FIGS. 1A and B, the reconfigurable card slots 20–22 are positioned on the a removable motherboard 60. The removable motherboard 60 has a wide section 62 on which the card slots 20–22 are mounted and a narrow section 64 which passes through an opening of a vertical midplane 80. The anterior portion of the wide section 62 of the motherboard forms the upper part of the business side of the router As will be described in more detail below, the card slots and NM slots are reconfigurable allow components with different form factors to be utilized in the same router chassis.

A first embodiment of the invention will now be describe that utilizes a field replaceable motherboard that can be removed and replaced without removing the router from the rack. FIG. 2 depicts an elevation view of the motherboard 60. The motherboard 60 has a wide external section 62 and a narrow insertion section 64. First and second MB tabs 65 and 66 on the wide external section extend beyond the narrow insertion section and each MB tab has a front edge comprising the business side of the motherboard and a rear edge. In this embodiment ejectors are used to insert the motherboard into the slot.

Figure 4:
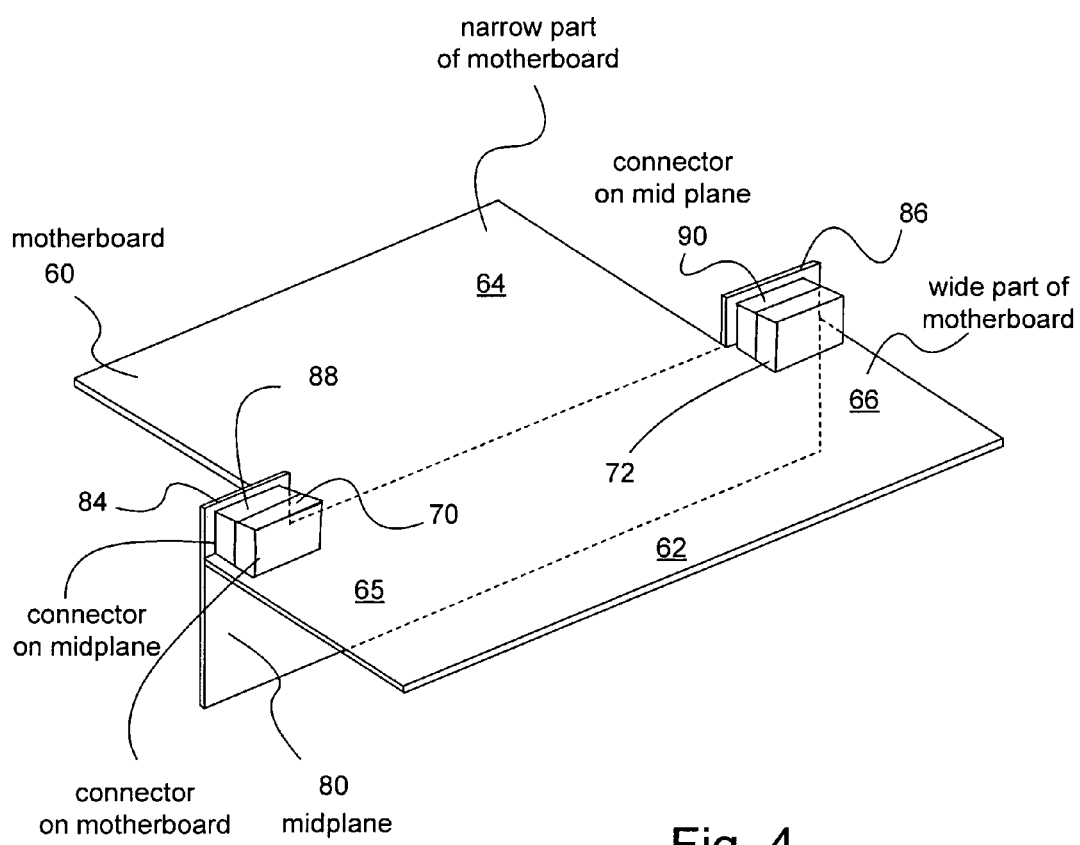
FIG. 4 is a perspective view of the motherboard and midplane.

The system for connecting the field replaceable motherboard 60 to the mid-plane 80 will now be described with reference to FIGS. 2 and 4. As depicted in FIG. 2, first and second motherboard connectors 70 and 72 are positioned on the surface of the motherboard 60 at the rear edges of the first and second MB tabs 65 and 66.

The mid-plane board 80 has a cutaway section bounded by tabs 84 and 86. First and second mid-plane connectors 88 and 90 are positioned on the tabs 84 and 86 of the midplane so that complementary motherboard connectors positioned on the rear edges of the MB tabs 65 and 66 of the removable mother board 60 mate with the mid-plane connectors when the narrow insertion section 64 is slid between the mid-plane tabs 84 and 86.

The presently described motherboard/mid-plane configuration allows the entire motherboard to be field-replaced without removing the router from a rack unit.

Figure 5:
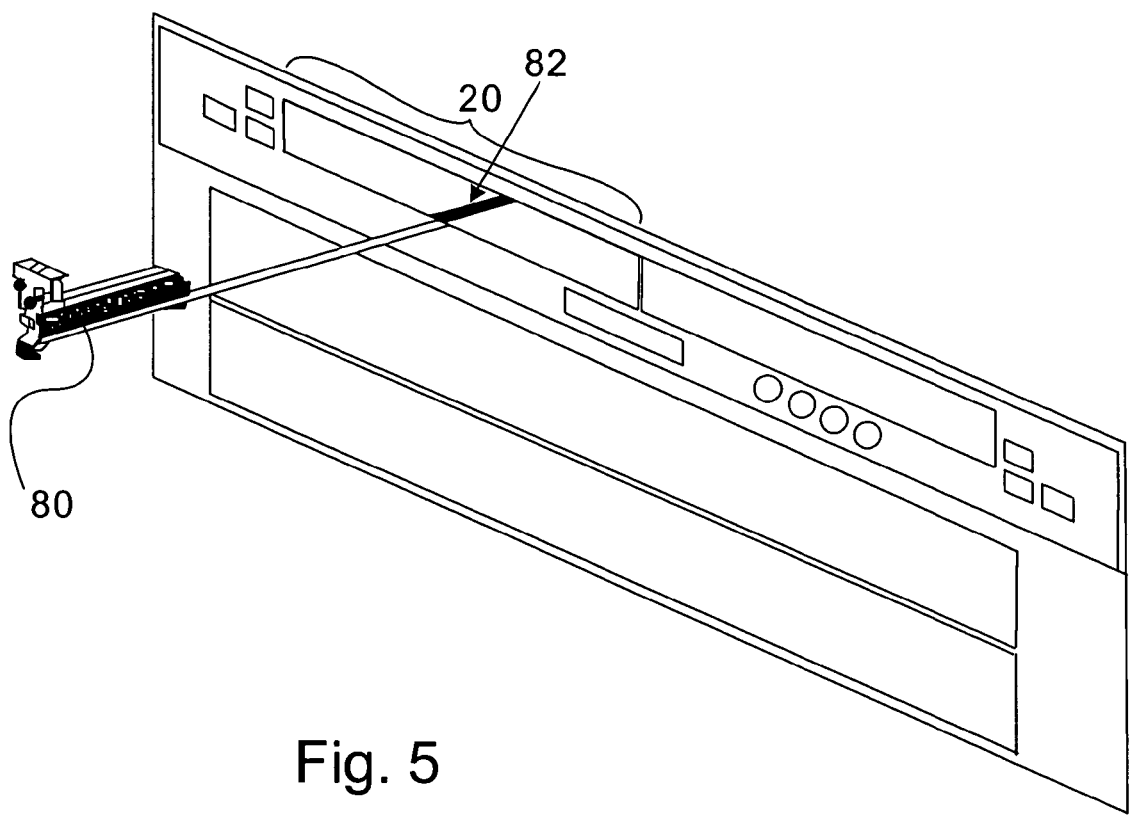
FIG. 5 is a perspective view of a card slot divider and a card slot.

Another feature of the presently described embodiment is a removable center guide that allows a card slot to be configured to hold two single wide cards or a single double wide card. FIG. 5 is a perspective view of a reconfigurable card slot 20 and a card slot divider 80, FIG. 6 depicts the insertion of the card slot divider into the card slot 20, and FIGS. 7A and B are detailed perspective views of the card slot divider 80.

Figure 6:
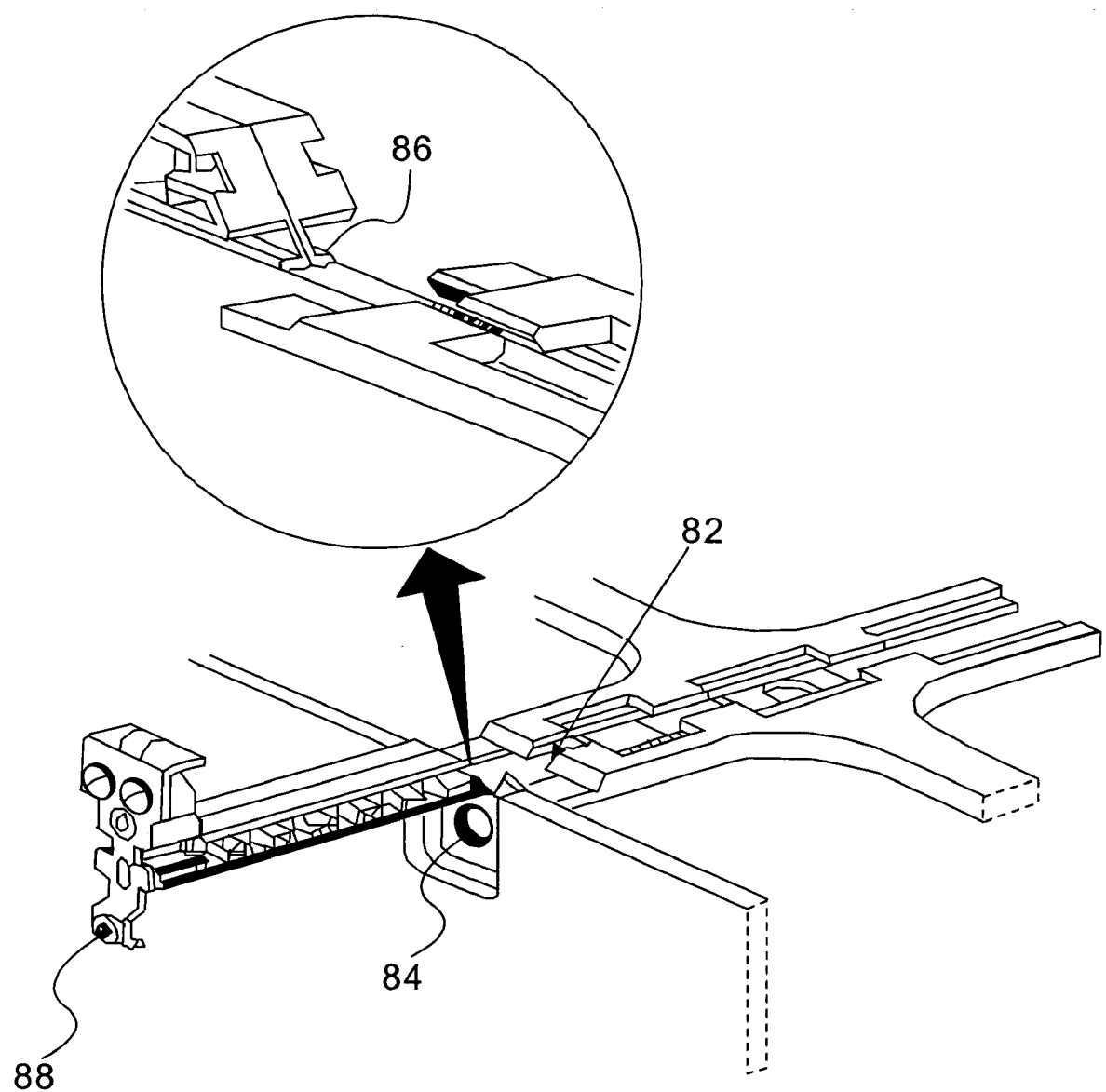
FIG. 6 is a perspective view of a card slot divider being inserted into a card slot.

Referring to FIGS. 5 and 6, the card slot 20 has a track 82 into which the card slot divider 80 is inserted. A rail on the lower part of the card slot divider slides into a track 82 located in the slot and screw hole 84 is located on the front of the slot below the track 82.

FIG. 6 is a more detailed view of the process of inserting the card slot divider 80. In this embodiment the track 82 is made of plastic and a rail 86, formed as the lower part of the slot divider, is slid into the track 82. A screw 88 is then tightened into the screw hole 84 on the slot bezel.

Figure 7A:
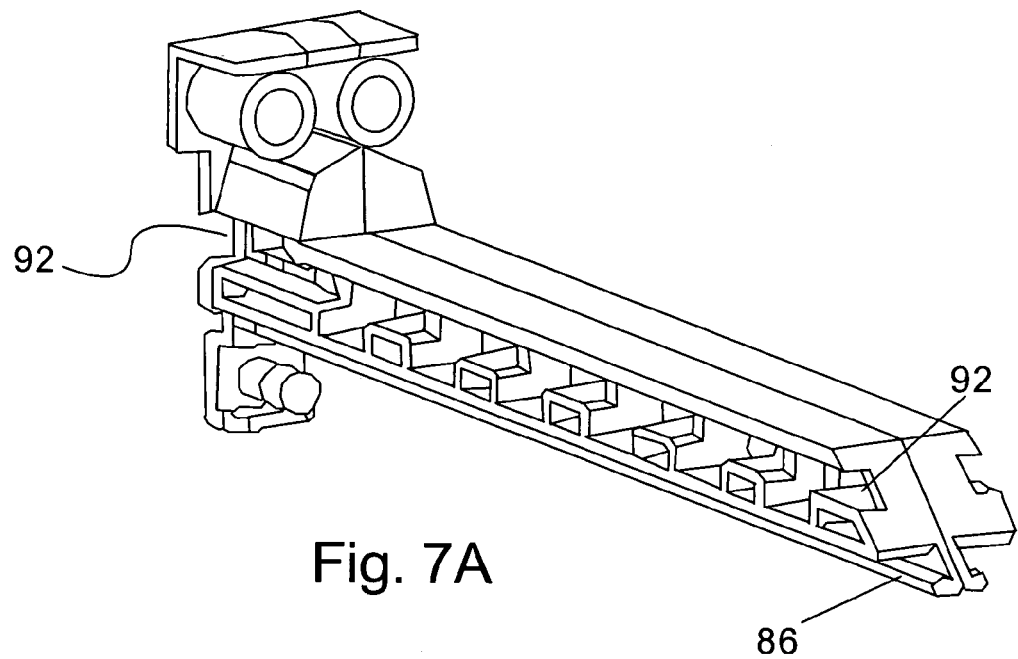
FIGS. 7A and B are perspective views of the card slot divider.
Figure 7B:
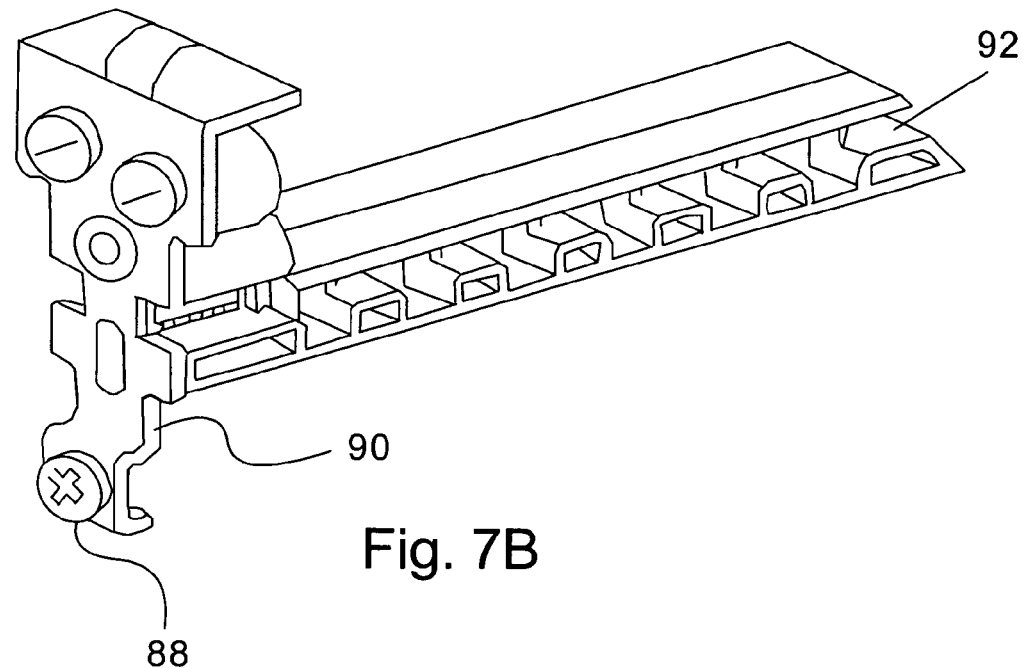

FIGS. 7A and B are detailed rear and front views, respectively, of the card slot divider 80. As described above, the card slot divider 80 includes a rail 86, a front tab 90 with screw, and also includes a card track 92 for guiding a card inserted into the card slot when the card slot divider 80 is installed.

Figure 8:
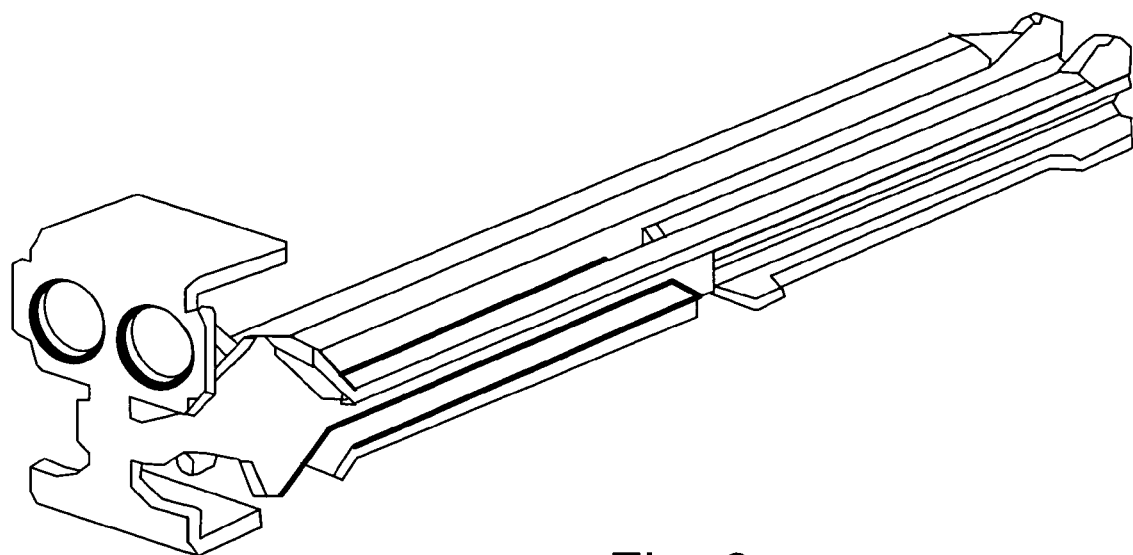
FIG. 8 is a perspective view of an alternate embodiment of the card slot divider.

An alternate embodiment of the card slot divider, depicted in FIG. 8, is a two-pronged metal slot divider that inserts into a guide. This two types of slot dividers depicted not interchangeable.

A network module slot is configurable to hold either an single Extra Double Wide Network Module (XDWNM), a single Double Wide Network Module (DWNM), or a combination of an Extra Single Wide Network Module (XSWNM) and/or a Single Wide Network Module (SWNM). This flexibility of configuration is utilized through the use of combinations of a NM slot divider and/or NM adaptor(s).

Figure 9A:
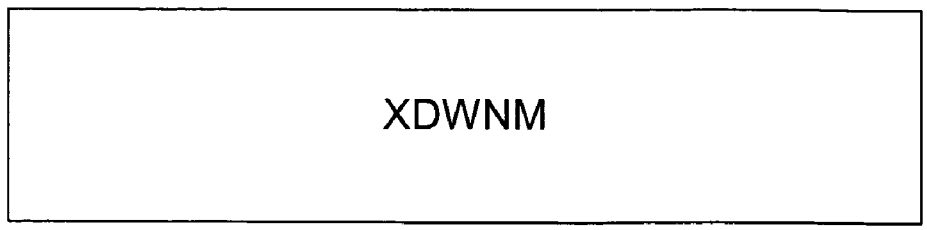
FIGS. 9A–9D are block diagrams of different Network Module slot configurations.
Figure 9B:
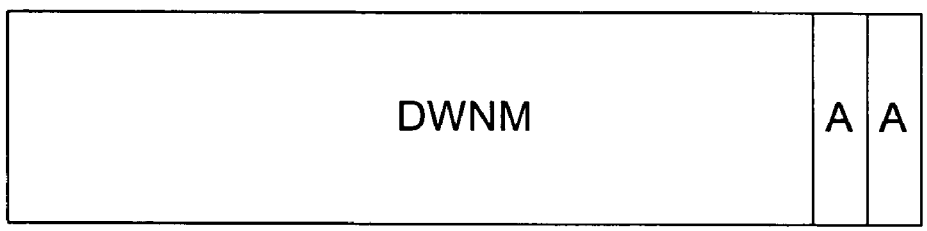
Figure 9C:
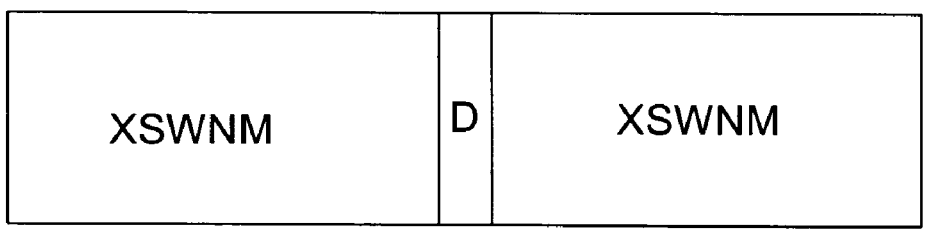
Figure 9D:
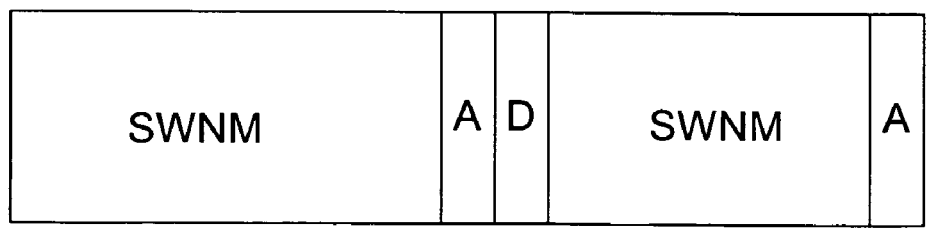

The configuration options for this embodiment are depicted schematically in FIG. 9A–D (not to scale). In FIG. 9A, an NM slot 20 with no divider or adapters holds an XDWNM. In FIG. 9B, two adapters (A) are inserted into one side of the NM slot so that the NM slot holds a DWNM. In FIG. 9C, a divider (D) is inserted into the NM slot 20 so that the NM slot holds two XSWNMs. In FIG. 9D, an adapter (A) is inserted adjacent to the right side of each XSWDM slot depicted in FIG. 9C so that the NM slot holds two SWNMs.

Network modules are in the form of boxes so the NM slots must have smooth bottom surfaces to allow insertion of network modules into the NM slots. Accordingly, a system of dividing and configuring the slots has been developed that allows the bottom surfaces of the slots to remain smooth to provide no obstructions when modules are inserted.

Figure 10A:
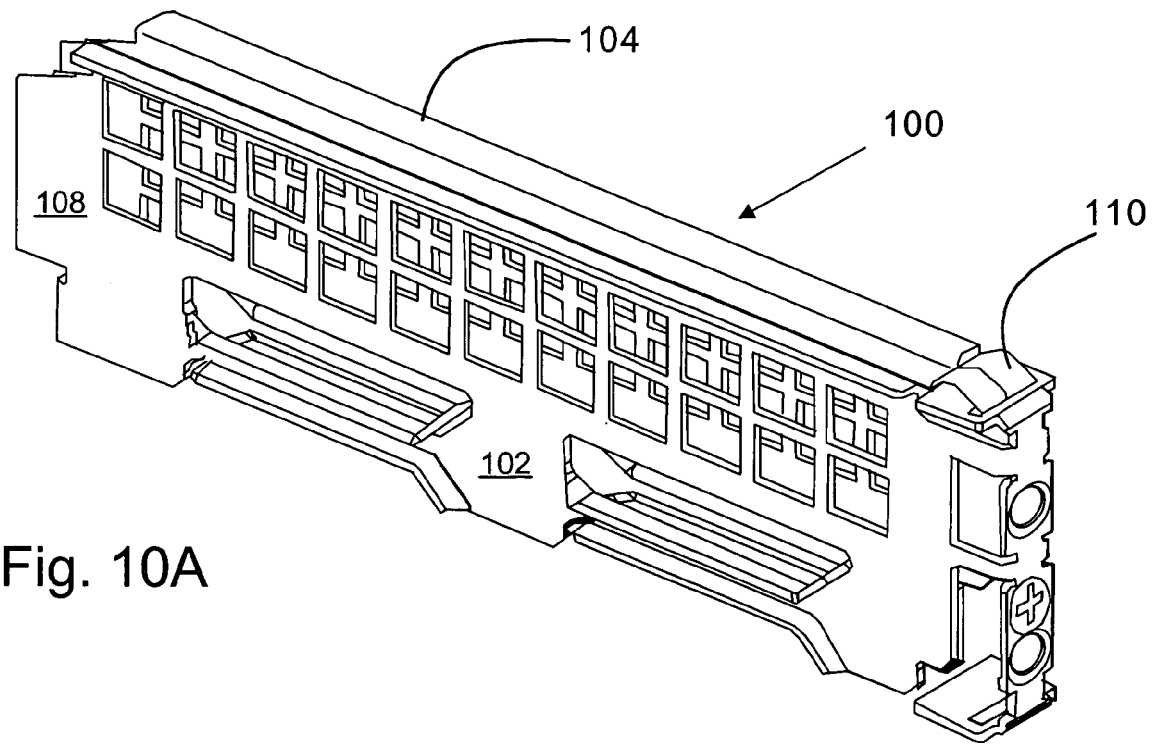
FIGS. 10A and B are perspective views of a Network Module slot divider.
Figure 10B:
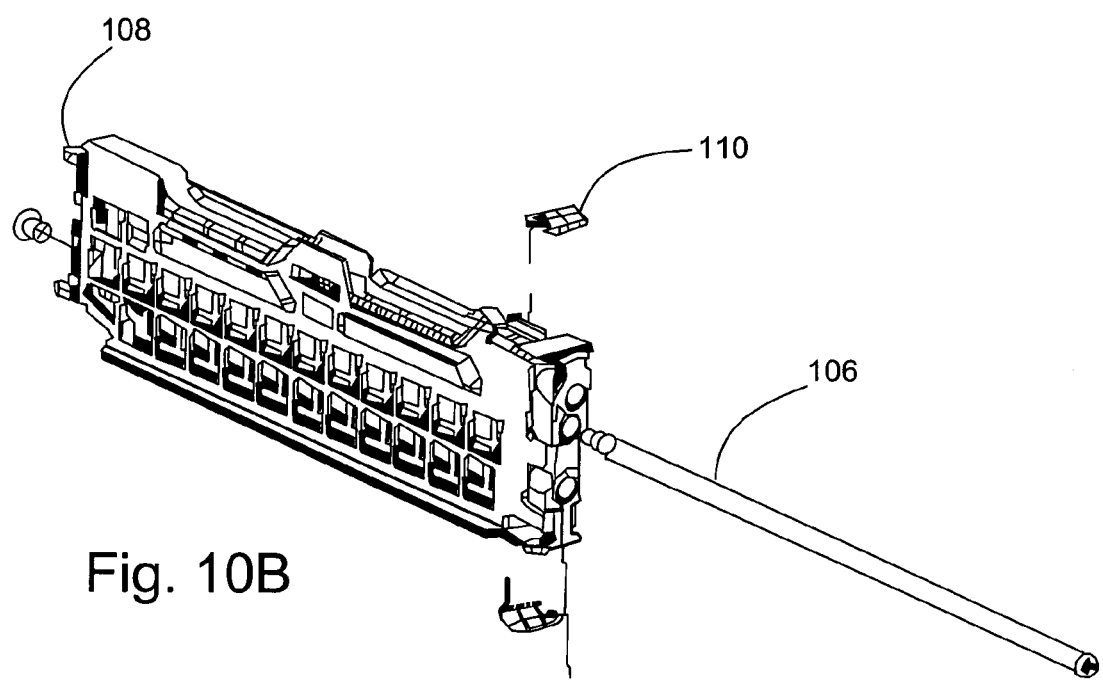

An embodiment of the NM slot divider will now be described with reference to FIGS. 10A and B and 11 A and B. In FIGS. 10A and B, the NM slot divider 100 is formed of an elongated body 102 including a top rail 104 and a guide for a long screw 106. Guide tabs 108 are located on the back side of the elongated body 102. The elongated body part 102 includes openings to allow cooling air circulation and clips 110 for EMI (Electromagnetic Interference) reduction.

Figure 11A:
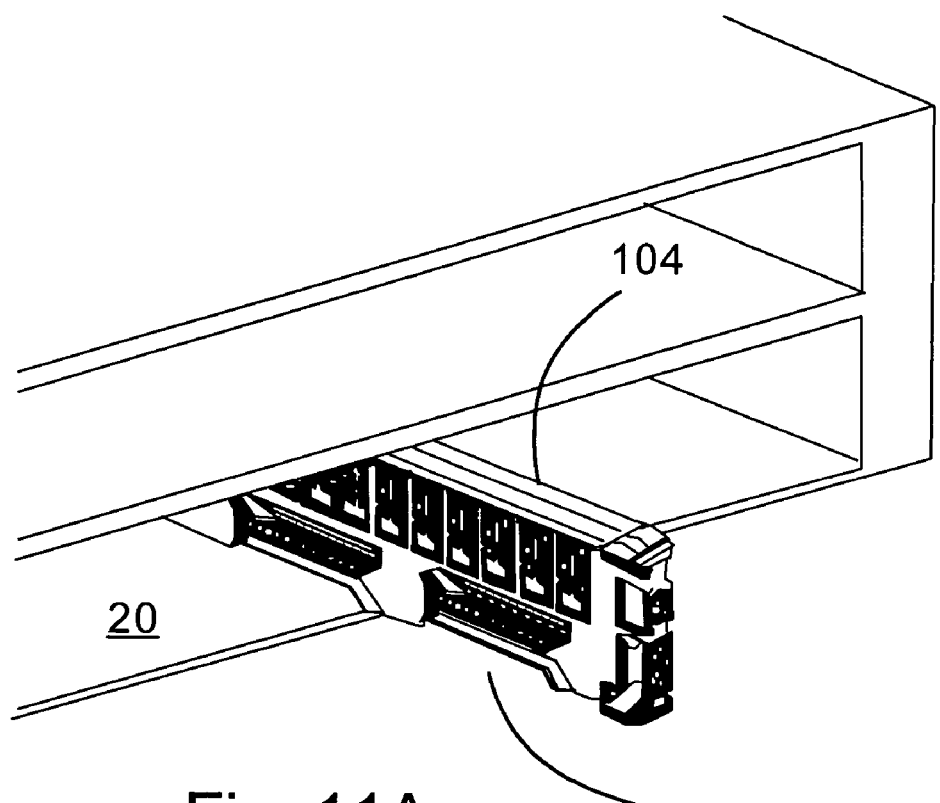
FIGS. 11A and B are perspective views of the insertion of a Network Module slot divider into a Network Module.
Figure 11B:
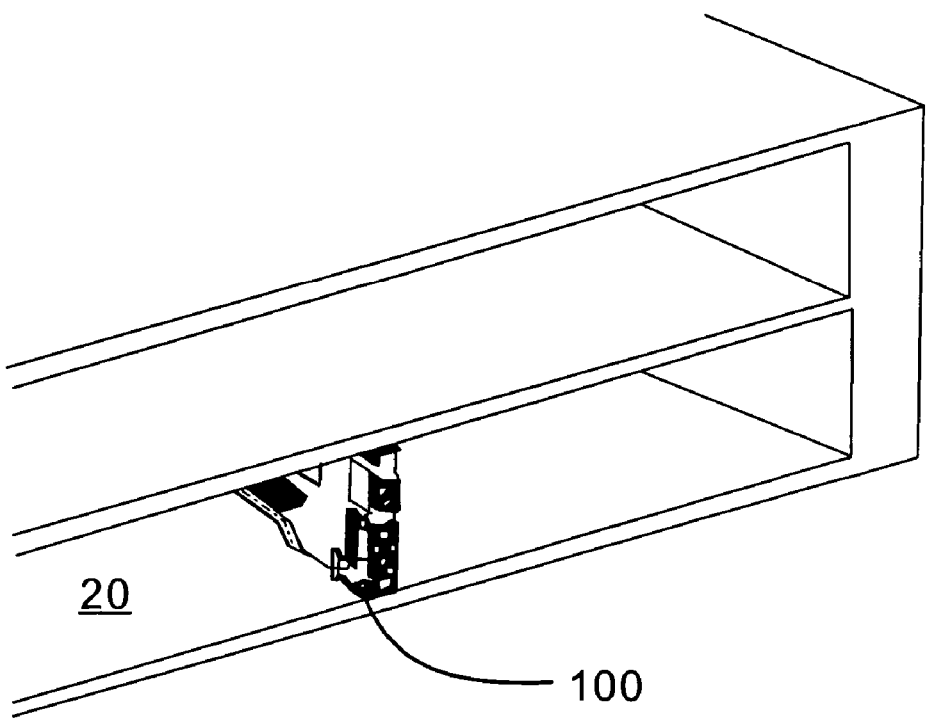

The process for inserting the NM slot divider 100 into the NM slot 20 is depicted in FIGS. 11A and B. In FIG. 11A, the top rails 104 of the NM slot divider 100 are inserted into guide rails (not shown) located at the top of the NM slot module 20. The NM slot divider 100 is pushed into the slot and the tip of the slot divider's screw 106 and guide slots 108 fit into holes in hardware mounted at the back of the slot. When it is fully seated, the front surface of the slot divider 100 is flush with the router's rear panel. FIG. 11B depicts the configuration depicted in FIG. 9C for holding two XSWNMs.

Figure 12A:
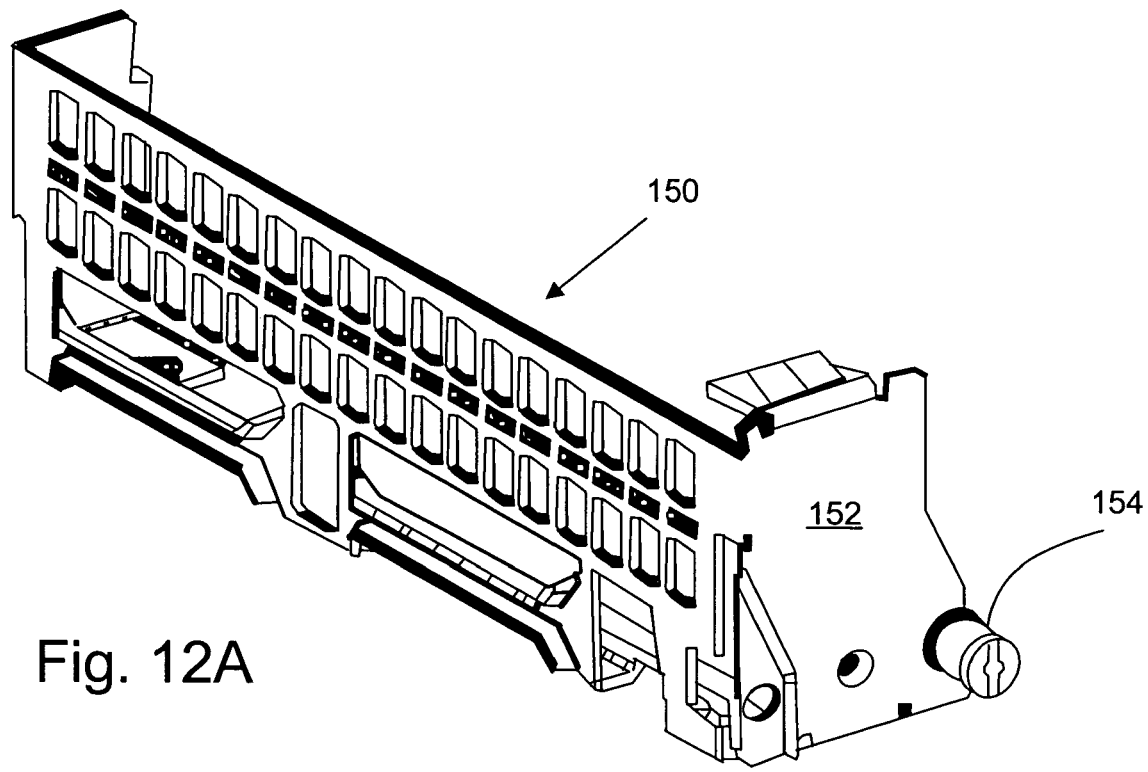
FIGS. 12A and B are perspective views of a Network Module slot adaptor.
Figure 12B:
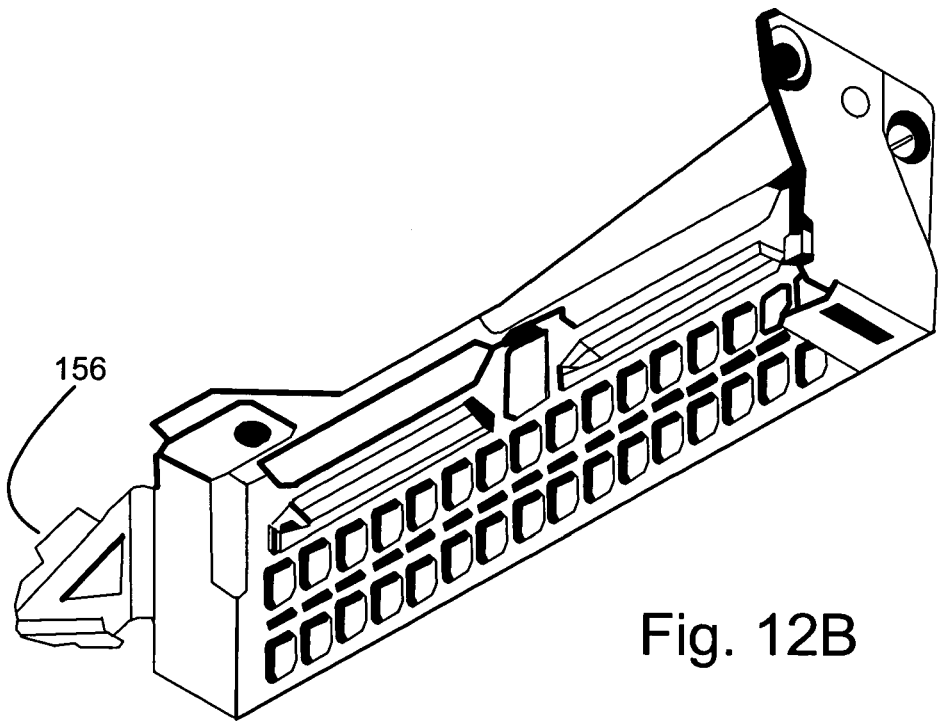

The slot adapters will now be described with reference to FIGS. 12A and B, FIG. 13, and FIGS. 14A and B. In FIGS. 12A and B, the slot adapter 150 includes a front face 152 having a thumbscrew 154 mounted therein. The end of the slot adapter has a triangular end 156 formed thereon. The slot adapter has rectangular holes to allow for cooling air circulation and clamps 158 for EMI (Electromagnetic Interference) reduction.

Figure 13:
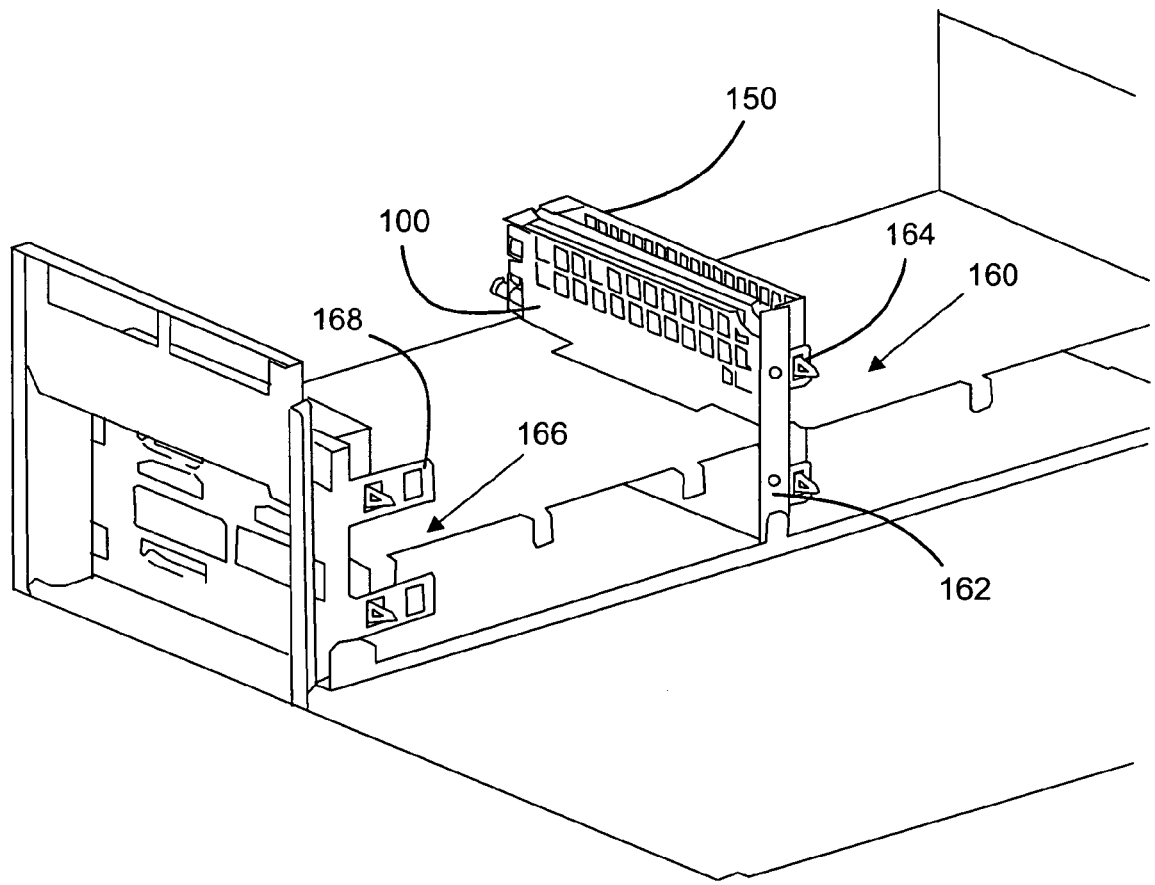
FIG. 13 is a perspective view of the hardware for mounting Network Module slots and adaptors.

FIG. 13 depicts the hardware configuration for holding the back ends of the card slot divider 100 and card slot adapter 150 stable in the NM slot. A single-capacity receptacle 160 is mounted mid-point at the rear of the slot and has an elongated section 162 for having threaded holes for accepting the tip of the long screw 106 and the the guide slots 108 of the module slot divider 100 and has a tab portiion 164 having a rectangular opening for accepting the triangular end of a slot adapter 150. A double-capacity receptacle 166 has a tab portion 168 having two rectangular openings for accepting the triangular ends of two slot adapters.

To insert a slot adapter, first the slot adapter is oriented for insertion, with the captive thumbscrew at the right side. Then, insert the slot adapter into the far right edge of the network module slot, guide the triangular end of the slot adapter into the rectangular hole at the back of the slot, and align the captive thumbscrew with the threaded hole in the chassis, slot divider, or adjacent slot adapter. The slot adapter may be fastened to the router chassis, to another slot adapter, or to a slot divider, depending on its installation location.

Figure 14A:
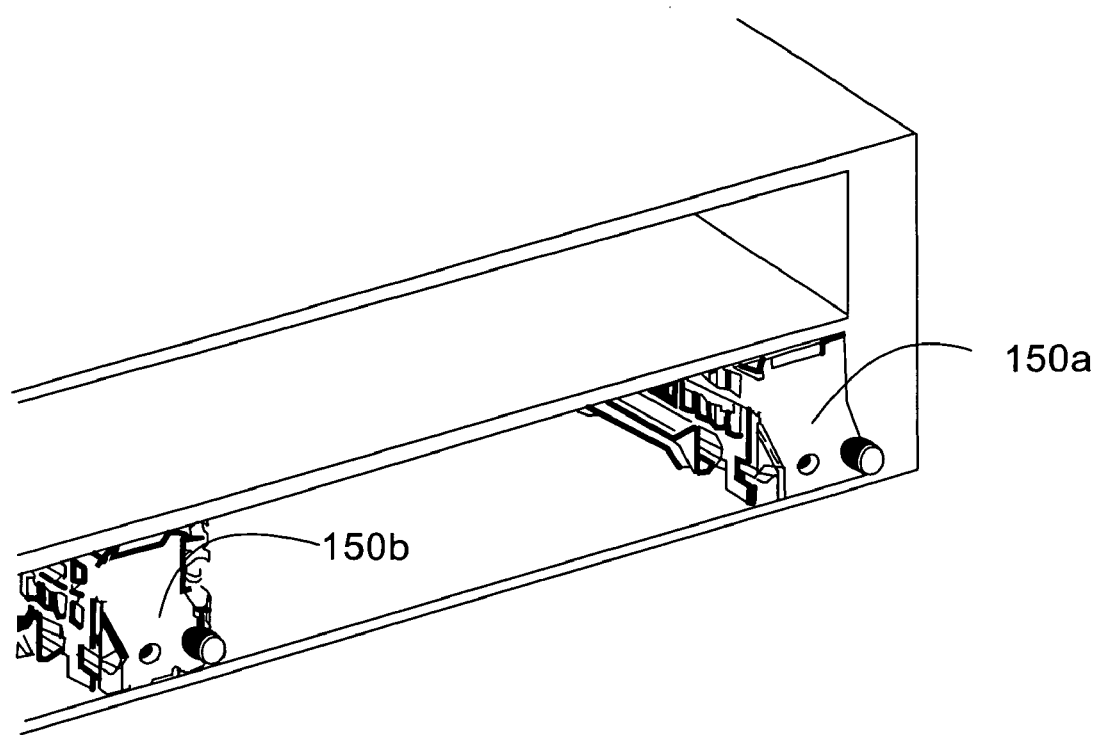
FIGS. 14A and B are perspective views of Network Module adaptors inserted in various configurations in Network Module slots.
Figure 14B:
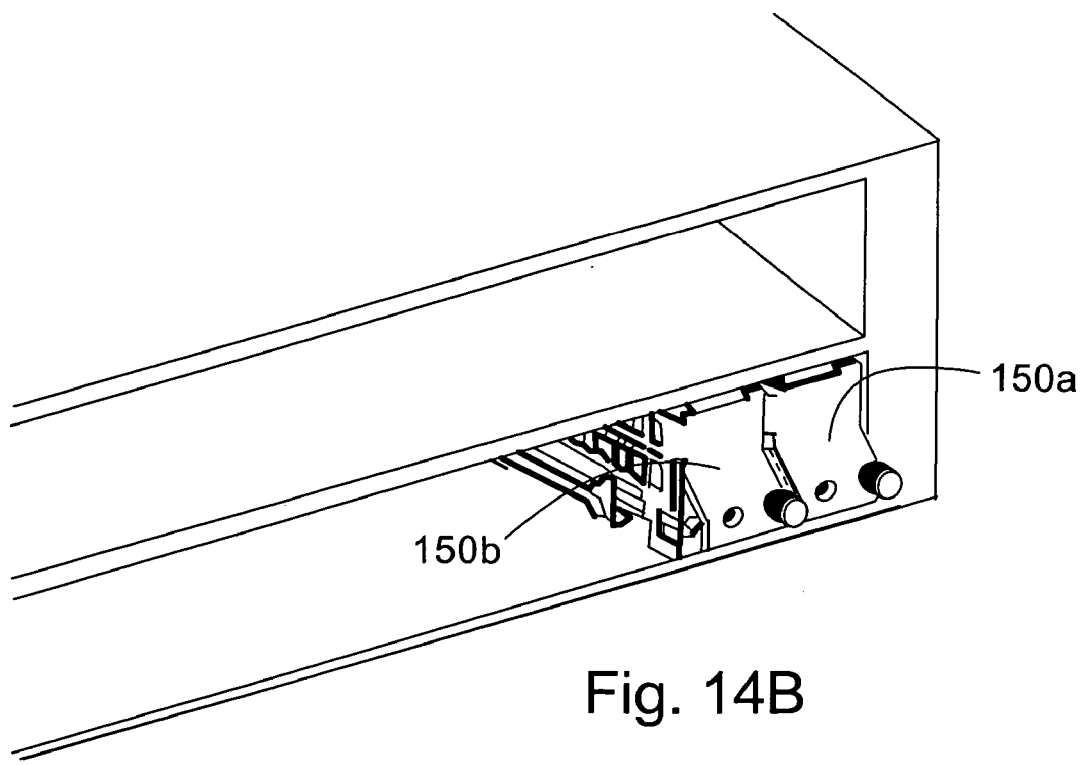

For example, in FIG. 14A, the first slot adapter 150a on the right is fastened to the chassis and the second slot adapter 150b at the left is fastened to a slot divider 100. In FIG. 14B, the first slot adapter 150a on the far right is fastened to the chassis and the second slot adapter 150b is fastened to the first slot adapter 150a.

FIG. 14A depicts the configuration of FIG. 9D for SWNMs and FIG. 14B depicts the configuration of FIG. 9B for a DWNM.

The invention has now been described with reference to the preferred embodiments. Alternatives and substitutions will now be apparent to persons of skill in the art. Accordingly, it is not intended to limit the invention except as provided by the appended claims.

What is claimed is:

1. A system for enabling field replacement of a component of a router without removing the router from a rack, the system comprising:
   a motherboard having a narrow insertion section and a wider external section, with the wider external section having a first and second motherboard tab forming parts of the wider external section that extend beyond the narrow insertion section, with each motherboard tab having a rear edge adjacent to the narrow insertion section;
   first and second motherboard connectors disposed, respectively, on the rear edges of the first and second motherboard tabs;
   a midplane, disposed within the router, having a cut-out section bounded by first and second midplane tabs; and
   first and second midplane connectors, mounted on the first and second midplane tabs, respectively, with the midplane tabs disposed so that the first and second motherboard connectors mate with respective first and second midplane connectors when the narrow insertion section of the motherboard is located between midplane tabs and the motherboard and the midplane are oriented substantially perpendicularly.

2. The system of claim 1 where:
   said motherboard connectors include a guiding member; and
   said midplane connectors include a guiding slot into which the guiding member is inserted to align the midplane connectors and motherboard connectors when the motherboard is inserted.

* * * * *